United States Patent
Bian et al.

(10) Patent No.: US 11,329,087 B2
(45) Date of Patent: May 10, 2022

(54) PHOTODETECTORS WITH ADJACENT ANODE-CATHODE PAIRS

(71) Applicant: GLOBALFOUNDRIES U.S. Inc., Santa Clara, CA (US)

(72) Inventors: Yusheng Bian, Ballston Lake, NY (US); Michel Rakowski, Ballston Spa, NY (US); Won Suk Lee, Malta, NY (US); Asif Chowdhury, Troy, NY (US); Ajey Poovannummoottil Jacob, Watervliet, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 150 days.

(21) Appl. No.: 16/829,553

(22) Filed: Mar. 25, 2020

(65) Prior Publication Data
US 2021/0305290 A1    Sep. 30, 2021

(51) Int. Cl.
*H01L 27/146*    (2006.01)
*H01L 31/101*    (2006.01)
*H01L 31/0232*    (2014.01)

(52) U.S. Cl.
CPC ...... *H01L 27/1463* (2013.01); *H01L 31/0232* (2013.01); *H01L 31/101* (2013.01)

(58) Field of Classification Search
CPC .......................... H01L 27/1463; H01L 31/101; H01L 31/0232
See application file for complete search history.

(56) References Cited

U.S. PATENT DOCUMENTS

| | | | |
|---|---|---|---|
| 5,525,828 A | 6/1996 | Bassous et al. | |
| 5,587,611 A * | 12/1996 | Botka | H01L 31/115 257/458 |
| 7,138,697 B2 | 11/2006 | Chu et al. | |
| 10,546,963 B2 * | 1/2020 | Hon | H01L 31/103 |
| 2005/0167709 A1 * | 8/2005 | Augusto | H01L 27/14643 257/292 |
| 2016/0155884 A1 * | 6/2016 | Hon | H01L 31/022416 250/200 |
| 2021/0091252 A1 * | 3/2021 | Atabaki | H01L 31/03682 |

FOREIGN PATENT DOCUMENTS

| | | | |
|---|---|---|---|
| CN | 109545804 A * | 3/2019 | |
| CN | 111223954 A * | 6/2020 | H01L 31/022408 |

OTHER PUBLICATIONS

Chowdhury et al., "PHOTODIODE", filed Feb. 24, 2020 as U.S. Appl. No. 16/799,183.
Rakowski, et al., "45nm CMOS—Silicon Photonics Monolithic Technology (45CLO) for next-generation, low power and high speed optical interconnects," in Optical Fiber Communication Conference (OFC) 2020, OSA Technical Digest Optical Society of America, 2020), paper T3H.3.

(Continued)

*Primary Examiner* — Sitaramarao S Yechuri
(74) *Attorney, Agent, or Firm* — Thompson Hine LLP; Anthony Canale (57) ABSTRACT

Structures for a photodetector and methods of fabricating a structure for a photodetector. The structure includes a light-absorbing region having a side edge, an anode adjacent to the side edge of the light-absorbing region, and a cathode adjacent to the side edge of the light-absorbing region.

20 Claims, 10 Drawing Sheets

(56) References Cited

OTHER PUBLICATIONS

Zeng, et al., "Silicon-germanium avalanche photodiodes with direct control of electric field in charge multiplication region," Optica 6, 772-777 (2019).
K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611.
Martinez, et al., "High performance waveguide-coupled Ge-on-Si linear mode avalanche photodiodes," Opt. Express 24, 19072-19081 (2016).

* cited by examiner

PHOTODETECTORS WITH ADJACENT ANODE-CATHODE PAIRS

BACKGROUND

The present invention relates to photonics chips and, more particularly, to structures for a photodetector and methods of fabricating a structure for a photodetector.

Photonics chips are used in many applications and systems, such as data communication systems and data computation systems. A photonics chip integrates optical components, such as waveguides and optical switches, and electronic components, such as field-effect transistors, into a unified platform. Among other factors, layout area, cost, and operational overhead may be reduced by the integration of both types of components.

Photonics chips include detectors that convert modulated light into an electrical signal. A common detector is a photodetector composed of a material, such as germanium, that is characterized by high absorption in the infrared wavelength range. The germanium photodetector converts modulated pulses of light into current as photons of electromagnetic radiation are absorbed in the germanium.

Improved structures for a photodetector and methods of fabricating a structure for a photodetector are needed.

SUMMARY

In an embodiment of the invention, a structure for a photodetector is provided. The structure includes a light-absorbing region having a side edge, an anode adjacent to the side edge of the light-absorbing region, and a cathode adjacent to the side edge of the light-absorbing region.

In an embodiment of the invention, a method of forming a structure for a photodetector is provided. The method includes forming a light-absorbing region, forming an anode adjacent to a side edge of the light-absorbing region, and forming a cathode adjacent to the side edge of the light-absorbing region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
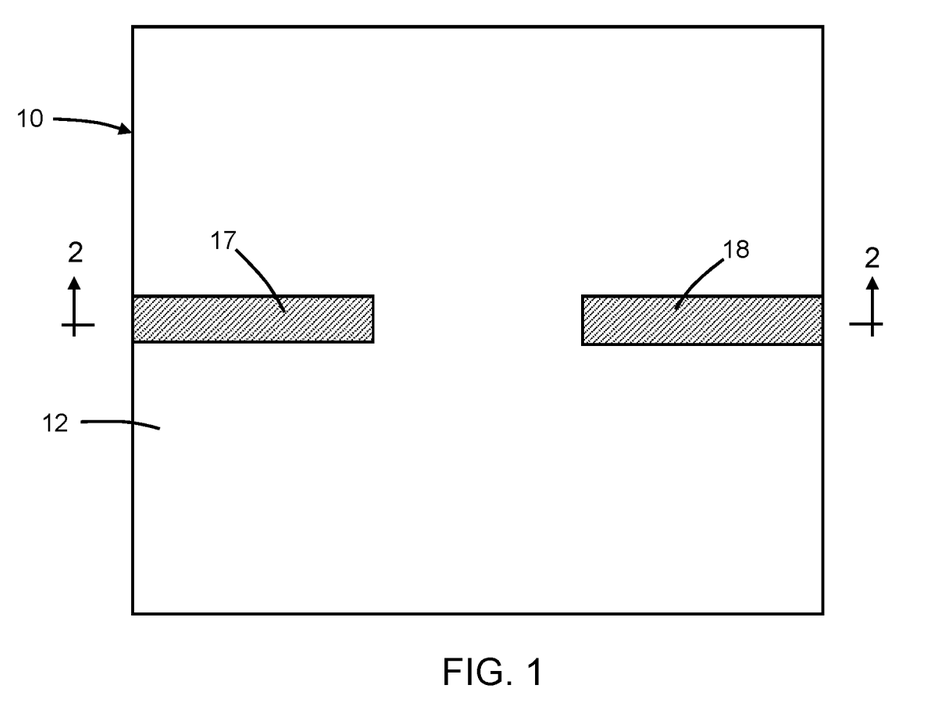
FIG. 1 is a top view of a structure at an initial fabrication stage of a processing method in accordance with embodiments of the invention.
Figure 2:
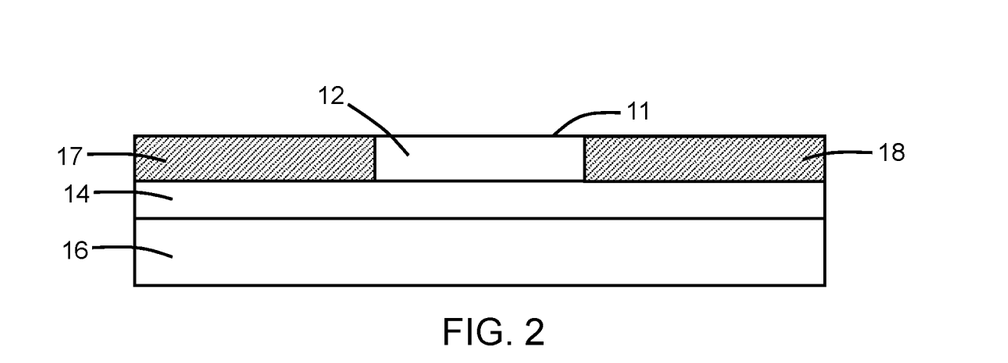
FIG. 2 is a cross-sectional view taken generally along line 2-2 in FIG. 1.

With reference to FIGS. 1, 2 and in accordance with embodiments of the invention, a substrate 10 in the representative form of a semiconductor-on-insulator (SOI) substrate includes a device layer 12 defining a semiconductor layer, a buried insulator layer 14, and a handle wafer 16. The device layer 12 is separated from the handle wafer 16 by the intervening buried insulator layer 14 and may be considerably thinner than the handle wafer 16. The device layer 12 and the handle wafer 16 may be composed of a single-crystal semiconductor material, such as single-crystal silicon, and may be lightly doped to have, for example, p-type conductivity. The buried insulator layer 14 may be composed of a dielectric material, such as silicon dioxide. The device layer 12 is electrically isolated from the handle wafer 16 by the buried insulator layer 14.

Shallow trench isolation regions 17, 18 may be formed by etching trenches in the device layer 12, depositing a dielectric material, such as silicon dioxide, in the trenches, and planarizing with chemical-mechanical polishing. The shallow trench isolation regions 17, 18 may penetrate fully through the device layer 12 to the buried insulator layer 14.

Figure 3:
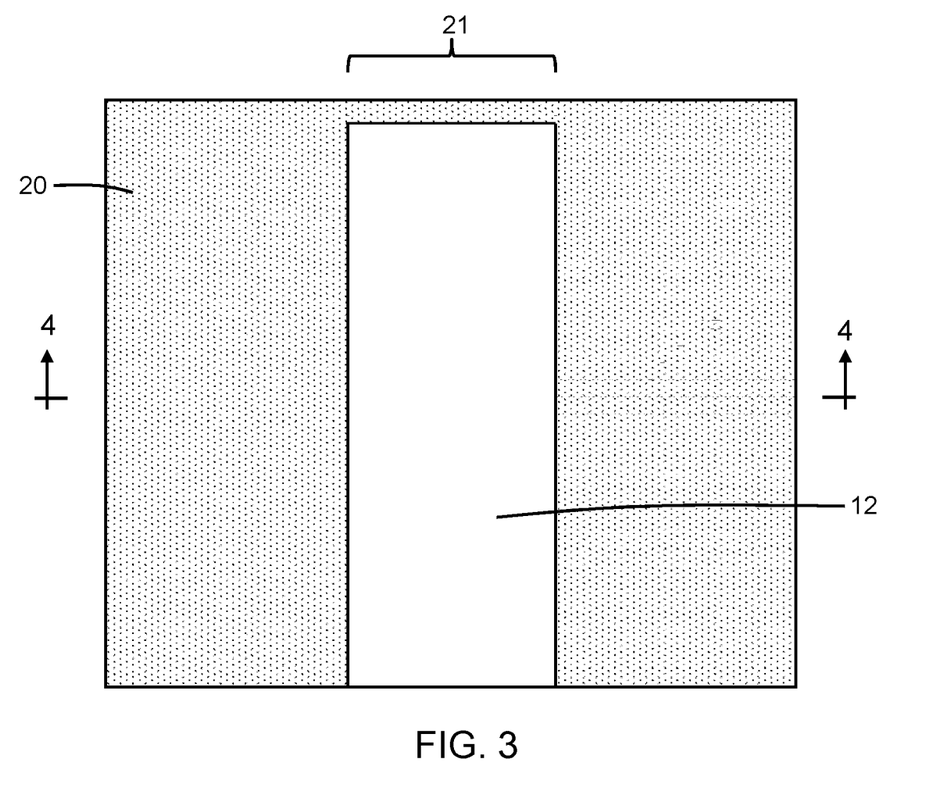
FIG. 3 is a top view of a structure at a fabrication stage of the processing method subsequent to FIG. 1.
Figure 4:
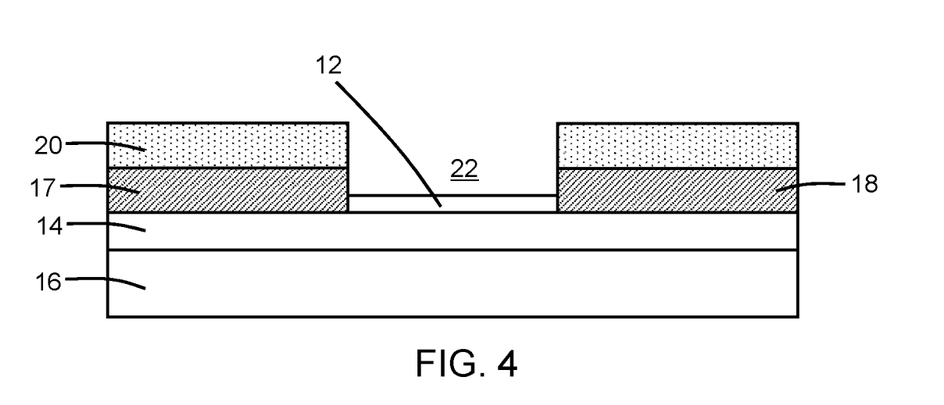
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, a dielectric layer 20 is deposited over a top surface 11 of the substrate 10 and is patterned by lithography and etching processes to define a window or opening 21. The dielectric layer 20 may be composed of a dielectric material, such as silicon nitride. The opening 21, which penetrates fully through the dielectric layer 20 to the device layer 12, exposes an area on the top surface 11 of the device layer 12. The opening 21 in the dielectric layer 20 may be located laterally between the shallow trench isolation region 17 and the shallow trench isolation region 18.

A trench 22 is formed in the device layer 12 that penetrates partially through the device layer 12. The trench 22 may be formed by an etching process, such as a reactive ion etching process. The patterned dielectric layer 20 functions as an etch mask during the etching process and the opening 21 in the patterned dielectric layer 20 defines the location in the device layer 12 for the trench 22. Surfaces of the device layer 12 border the trench 22.

Figure 5:
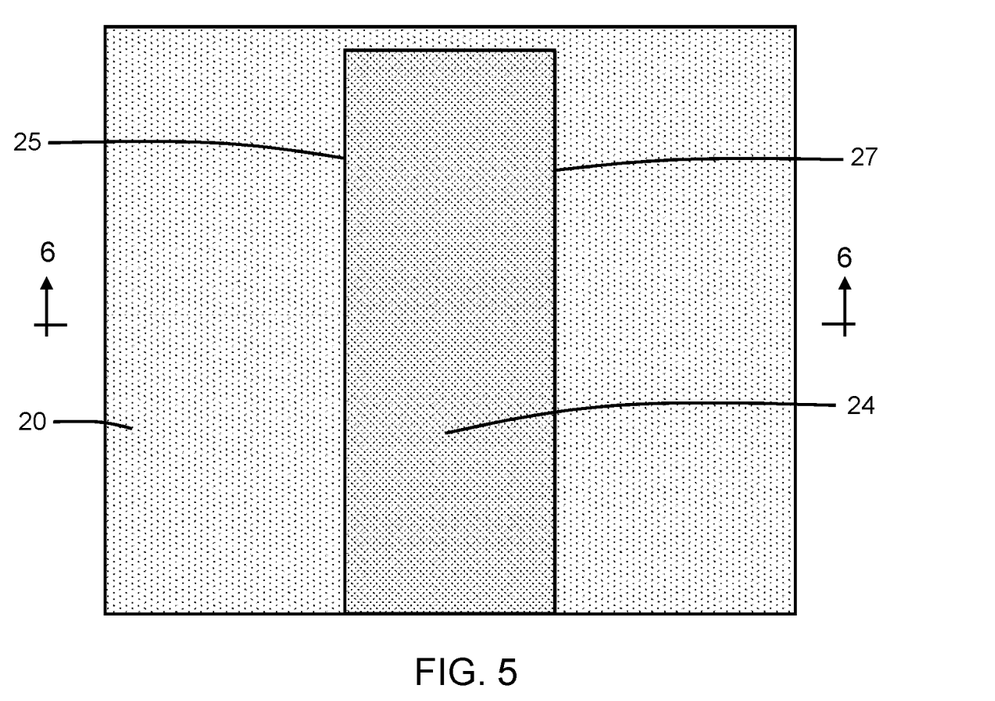
FIG. 5 is a top view of a structure at a fabrication stage of the processing method subsequent to FIG. 3.
Figure 6:
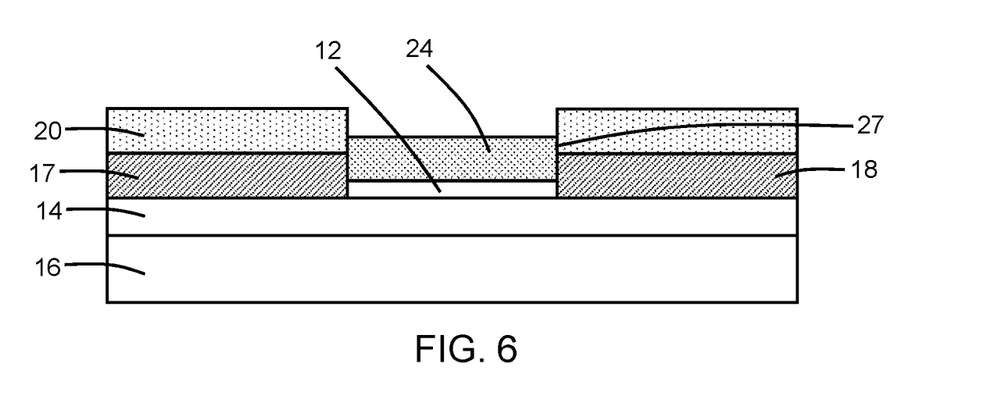
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, a layer 24 containing a light-absorbing material is deposited inside the trench 22 and defines a light-absorbing region of a photodetector. In an embodiment, the layer 24 may have a composition that includes germanium. In an embodiment, the layer 24 may be composed of elemental germanium. In an embodiment, the trench 22 and the layer 24 inside the trench 22 may extend from the shallow trench isolation region 17 to the shallow trench isolation region 18. The layer 24 includes opposite side edges 25, 27 that define the width of the light-absorbing region and ends that join the side edges 25, 27. The shallow trench isolation region 17 terminates at the side edge 25 of the layer 24, and the shallow trench isolation region 18 terminates at the side edge 27 of the layer 24.

In an embodiment, the layer 24 may be selectively deposited such that material does not deposit on the dielectric material of the dielectric layer 20. In an embodiment, the surfaces of the device layer 12 bordering the trench 22 may be subjected to a surface preparation process, followed by chemical vapor deposition of germanium, which grows only where the semiconductor surfaces of the device layer 12 are exposed, leading to selective deposition and minimization of threading dislocation density.

Figure 7:
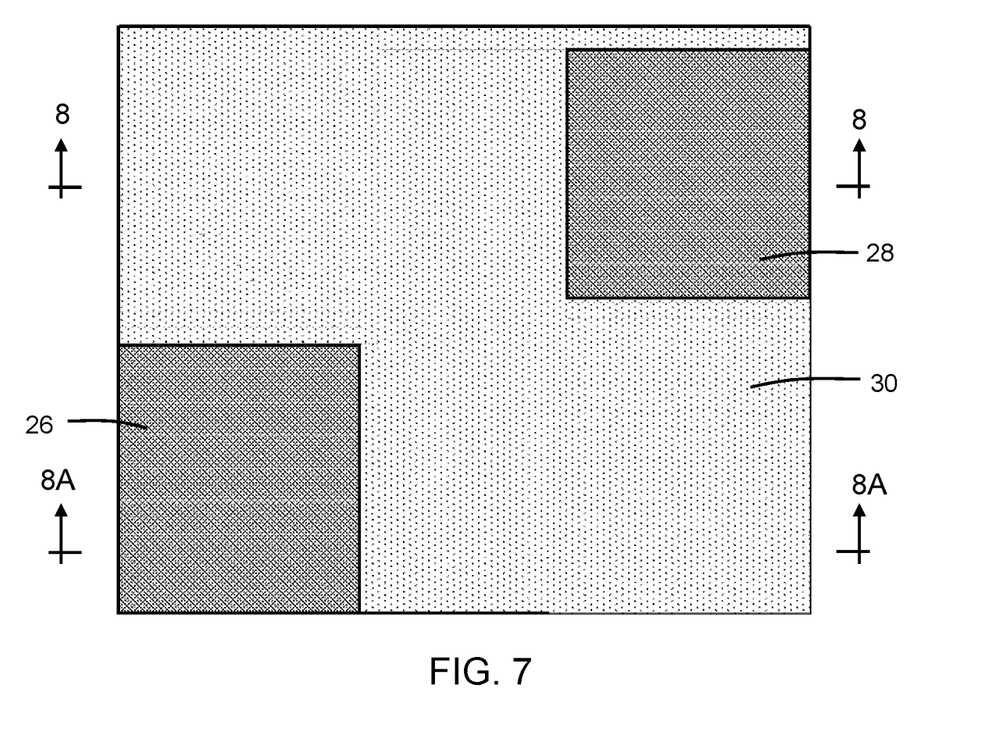
FIG. 7 is a top view of a structure at a fabrication stage of the processing method subsequent to FIG. 5.
Figure 8:
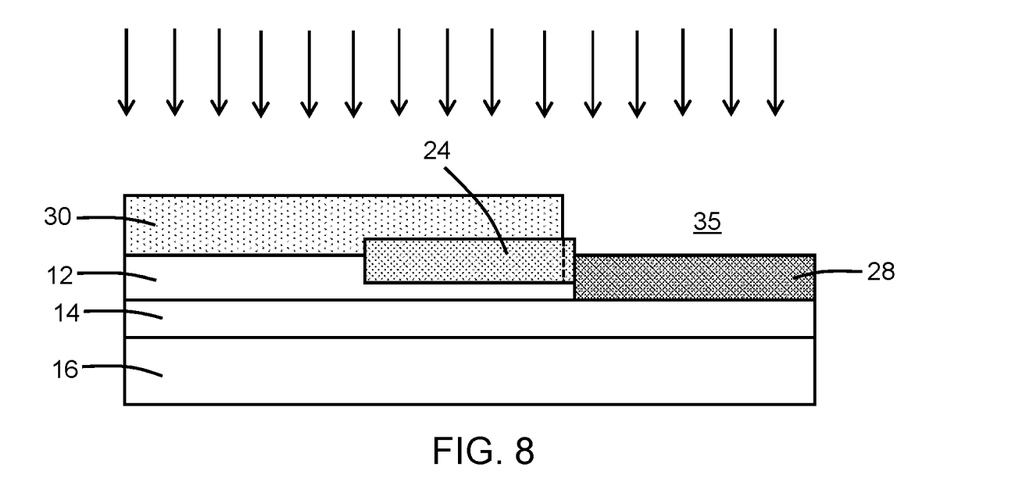
FIG. 8 is a cross-sectional view taken generally along line 8-8 in FIG. 7.
Figure 8A:
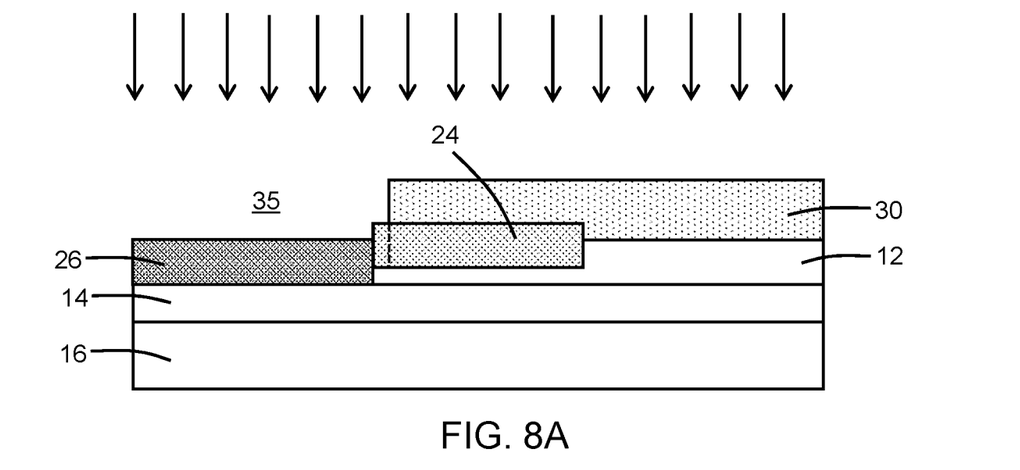
FIG. 8A is a cross-sectional view taken generally along line 8A-8A in FIG. 7.

With reference to FIGS. 7, 8, 8A in which like reference numerals refer to like features in FIGS. 5, 6 and at a subsequent fabrication stage, a doped region 26 and a doped region 28 are formed in respective portions of the device layer 12. In an embodiment, the doped regions 26, 28 may extend through the entire thickness of the device layer 12 to the buried insulator layer 14. In particular, the doped regions 26, 28 may extend from the top surface of the device layer 12 fully through the device layer 12 to the interface between the device layer 12 and the buried insulator layer 14. The layer 24 may be arranged laterally at its side edges 25, 27 between the doped region 26 and the doped region 28. The shallow trench isolation regions 17, 18 define respective boundaries for the doped regions 26, 28 in a direction parallel to the side edges 25, 27 of the layer 24.

The doped regions 26, 28 may be formed by, for example, ion implantation with an implantation mask 30 covering an area over the device layer 12 to determine the implanted areas of the device layer 12 for the doped regions 26, 28. The implantation mask 30 may include a layer of a light-sensitive material, such as a photoresist, applied by a spin-coating process, pre-baked, exposed to light projected through a photomask, baked after exposure, and developed with a chemical developer to define openings 35. The openings 35 in the implantation mask 30 are arranged over areas of the device layer 12 to be implanted and each opening 35 in the implantation mask 30 may overlap at one edge with the shallow trench isolation regions 17, 18. The implantation conditions (e.g., ion species, dose, kinetic energy) may be selected to tune the electrical and physical characteristics of the doped regions 26, 28. The implantation mask 30 may be stripped after forming the doped regions 26, 28.

In an embodiment, respective portions of the layer 24 may be implanted such that portions of the doped regions 26, 28 are located in the layer 24, as indicated by the dashed lines in FIGS. 8, 8A. The concurrent implantation of the layer 24 may be provided by slightly overlapping each opening 35 in the implantation mask 30 at its interior edge with the layer 24 such that the openings 35 extend inward past the side edges 25, 27 of the layer 24. In an embodiment, the semiconductor material of the doped regions 26, 28 may be doped with a p-type dopant (e.g., boron) that provides p-type conductivity. In an embodiment, the doped regions 26, 28 may be moderately doped to contain a dopant concentration in a range equal to about $1 \times 10^{17}$ atoms/cm$^3$ to about $5 \times 10^{18}$ atoms/cm$^3$.

Figure 9:
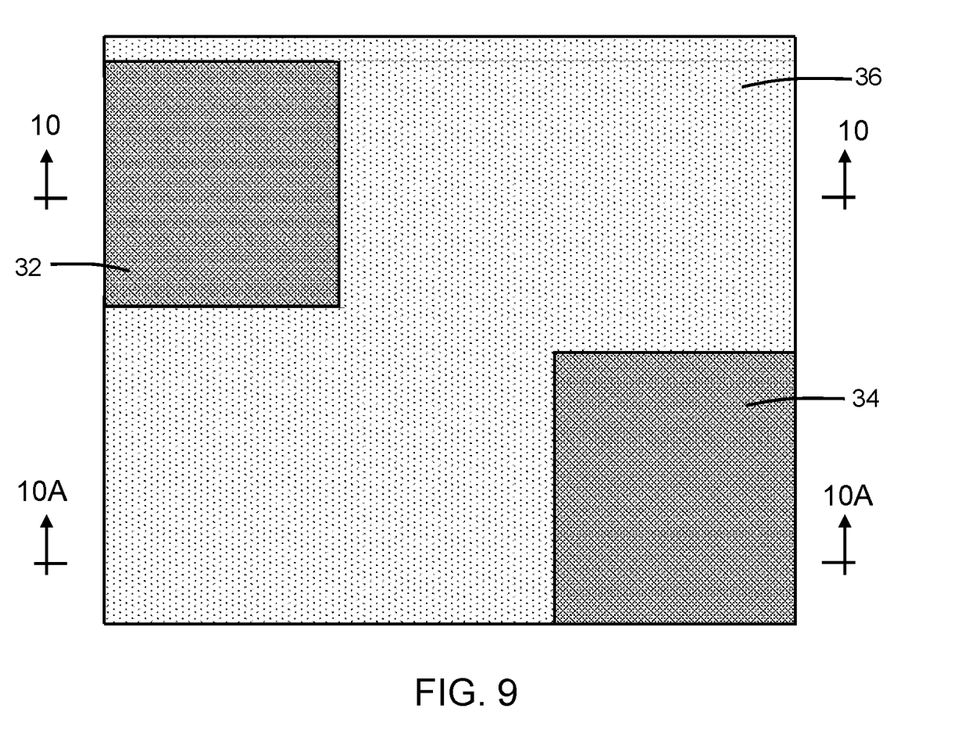
FIG. 9 is a top view of a structure at a fabrication stage of the processing method subsequent to FIG. 7.
Figure 10:
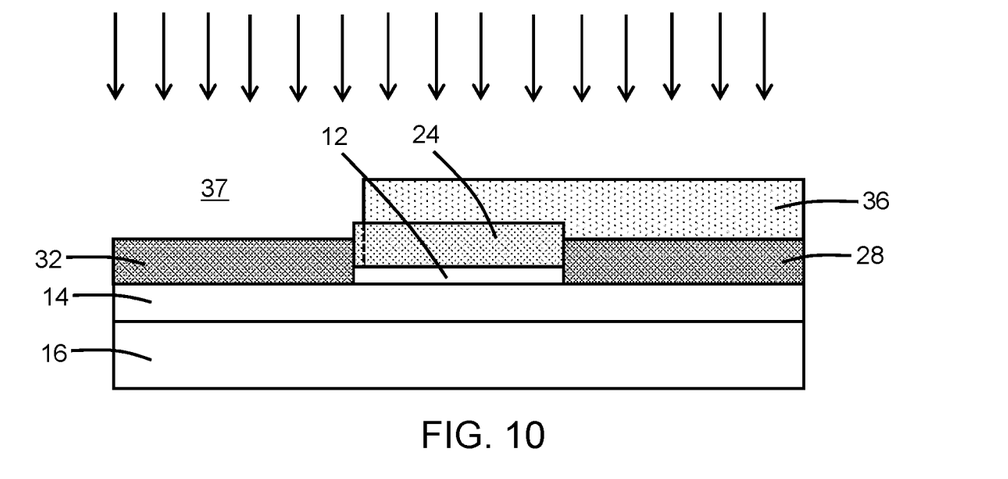
FIG. 10 is a cross-sectional view taken generally along line 10-10 in FIG. 9.
Figure 10A:
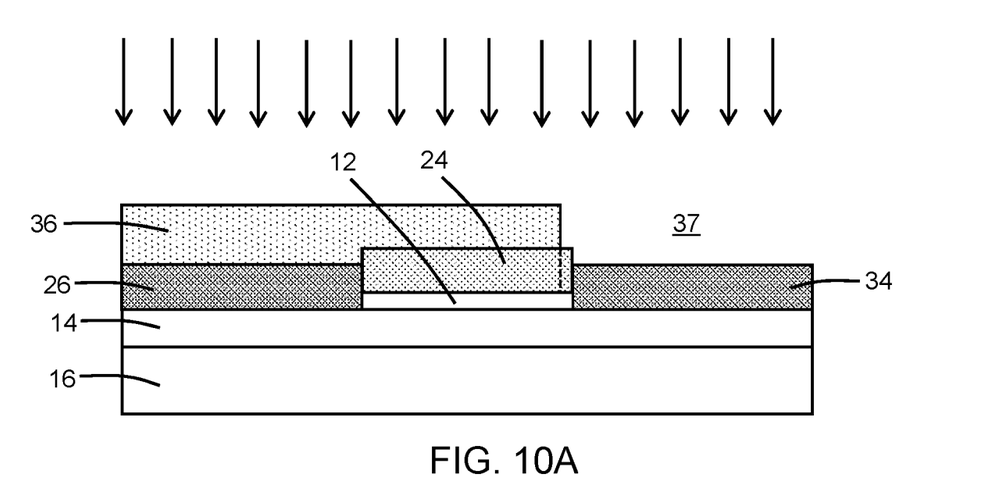
FIG. 10A is a cross-sectional view taken generally along line 10A-10A in FIG. 9.

With reference to FIGS. 9, 10, 10A in which like reference numerals refer to like features in FIGS. 7, 8, 8A and at a subsequent fabrication stage, a doped region 32 and a doped region 34 are formed in respective portions of the device layer 12 that are non-coincident with the portions of the device layer 12 containing the doped regions 26, 28. In an embodiment, the doped regions 32, 34 may extend through the entire thickness of the device layer 12 to the buried insulator layer 14. In particular, the doped regions 32, 34 may extend from the top surface of the device layer 12 fully through the device layer 12 to the interface between the device layer 12 and the buried insulator layer 14. The shallow trench isolation regions 17, 18 define respective boundaries for the doped regions 32, 34 in a direction parallel to the side edges 25, 27 of the layer 24.

The doped regions 32, 34 may be formed by, for example, ion implantation with an implantation mask 36 covering an area over the device layer 12 to determine the implanted areas of the device layer 12 for the doped regions 32, 34. The implantation mask 36 may include a layer of a light-sensitive material, such as a photoresist, applied by a spin-coating process, pre-baked, exposed to light projected through a photomask, baked after exposure, and developed with a chemical developer to define openings 37. The openings 37 in the implantation mask 36 are arranged over areas of the device layer 12 to be implanted and each opening 37 in the implantation mask 36 may overlap at one edge with the shallow trench isolation regions 17, 18. The implantation mask 36 covers the portions of the device layer 12 containing the doped regions 26, 28. The implantation conditions (e.g., ion species, dose, kinetic energy) may be selected to tune the electrical and physical characteristics of the doped regions 32, 34. The implantation mask 36 may be stripped after forming the doped regions 32, 34.

In an embodiment, respective portions of the layer 24 may be implanted such that portions of the doped regions 32, 34 may be located in the layer 24, as indicated by the dashed lines in FIGS. 10, 10A. The concurrent implantation of the layer 24 may be provided by slightly overlapping each opening 37 in the implantation mask 36 at its interior edge with the layer 24 such that the openings 37 extend inward past the side edges 25, 27 of the layer 24. The doped regions 32, 34 are doped to have an opposite conductivity type from the doped regions 26, 28. In an embodiment, the semiconductor material of the doped regions 32, 34 may be doped with an n-type dopant (e.g., phosphorus and/or arsenic) that provides n-type conductivity. In an embodiment, the doped regions 32, 34 may be moderately doped to contain a dopant concentration in a range equal to about $1 \times 10^{17}$ atoms/cm$^3$ to about $5 \times 10^{18}$ atoms/cm$^3$.

The doped region 26 is positioned on an opposite side of the shallow trench isolation region 17 from the doped region 32 along the side edge 25 of the layer 24. The doped region 28 is positioned on an opposite side of the shallow trench isolation region 18 from the doped region 34 along the side edge 27 of the layer 24. The layer 24 may be laterally positioned between the doped regions 26, 32 and the doped regions 28, 34. The side edge 25 of the layer 24 is located adjacent to the doped regions 26, 32 and the shallow trench isolation region 17, and the side edge 27 of the layer 24 is located adjacent to the doped regions 26, 32 and the shallow trench isolation region 18.

Figure 11:
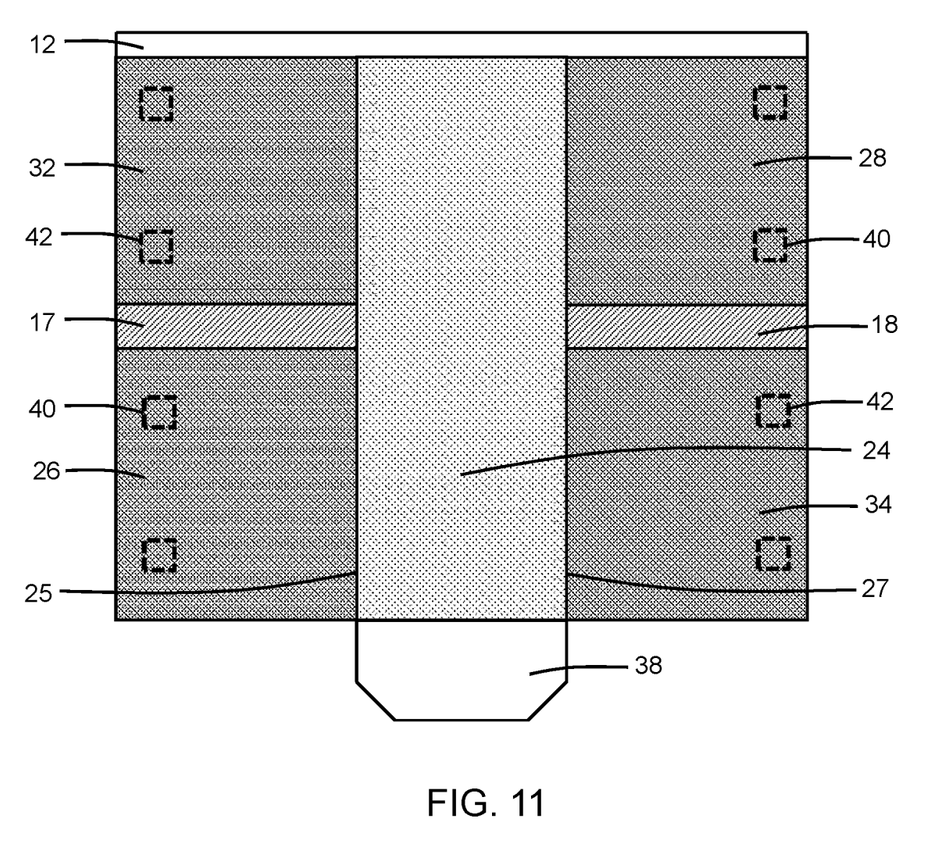
FIG. 11 is a top view of a structure at a fabrication stage of the processing method subsequent to FIG. 9.

With reference to FIG. 11 in which like reference numerals refer to like features in FIGS. 9, 10, 10A and at a subsequent fabrication stage, a waveguide 38 is formed that is coupled to the layer 24. The waveguide 38 directs light to the layer 24 for conversion into electrical signals. The waveguide 38 may be formed by patterning the device layer 12 with lithography and etching processes.

Middle-of-line (MOL) processing and back-end-of-line (BEOL) processing follow, which includes formation of silicide, contacts, vias, and wiring for an interconnect structure that is coupled with the photodetector. In particular, contacts 40 to the doped regions 26, 28 and contacts 42 to the doped regions 32, 34 are shown diagrammatically in dashed lines. Heavily-doped regions (not shown) may be provided in the doped regions 26, 28 and in the doped regions 32, 34, and may lower the contact resistance. The layer 24 is not contacted by contacts of the interconnect structure.

The completed photodetector includes the doped regions 26, 28 as cathodes, the doped regions 32, 34 as anodes, and the layer 24 as the light-absorbing region. The shallow trench isolation region 17 is positioned laterally between the cathode represented by doped region 26 and the anode represented by the doped region 32. The shallow trench isolation region 18 is positioned laterally between the cathode represented by doped region 28 and the anode represented by the doped region 34. The layer 24 is positioned laterally between the doped regions 26, 32 representing an anode-cathode pair and the doped regions 28, 34 also representing an anode-cathode pair.

In use, laser light is directed by the waveguide 38 to the layer 24, which absorbs the photons of light. The biased anodes provide multiplication regions with high electric fields. The junctions extend into the layer 24 at locations proximate to the shallow trench isolation regions 17, 18 and an avalanche effect occurs at these locations, which are characterized by a high electric field.

Placing anode-cathode pairs along opposite side edges of the light-absorbing region may reduce the operating voltage of the photodetector, enhance the gain of the photodetector, reduce the capacitance of the photodetector, and enhance the bandwidth of the photodetector. The breakdown voltage of the photodetector may be reduced without placing contacts on the light-absorbing region. The structure for the photodetector is readily integrated with low-voltage CMOS technologies. The structure for the photodetector may exhibit a high avalanche gain at a low operating voltage. The additional electric field proximate to the shallow trench isolation regions 17, 18 may speed up charge carriers such that the light-absorbing region may be widened without reducing carrier transit time, quantum efficiency may be enhanced, and responsivity may be improved.

Figure 12:
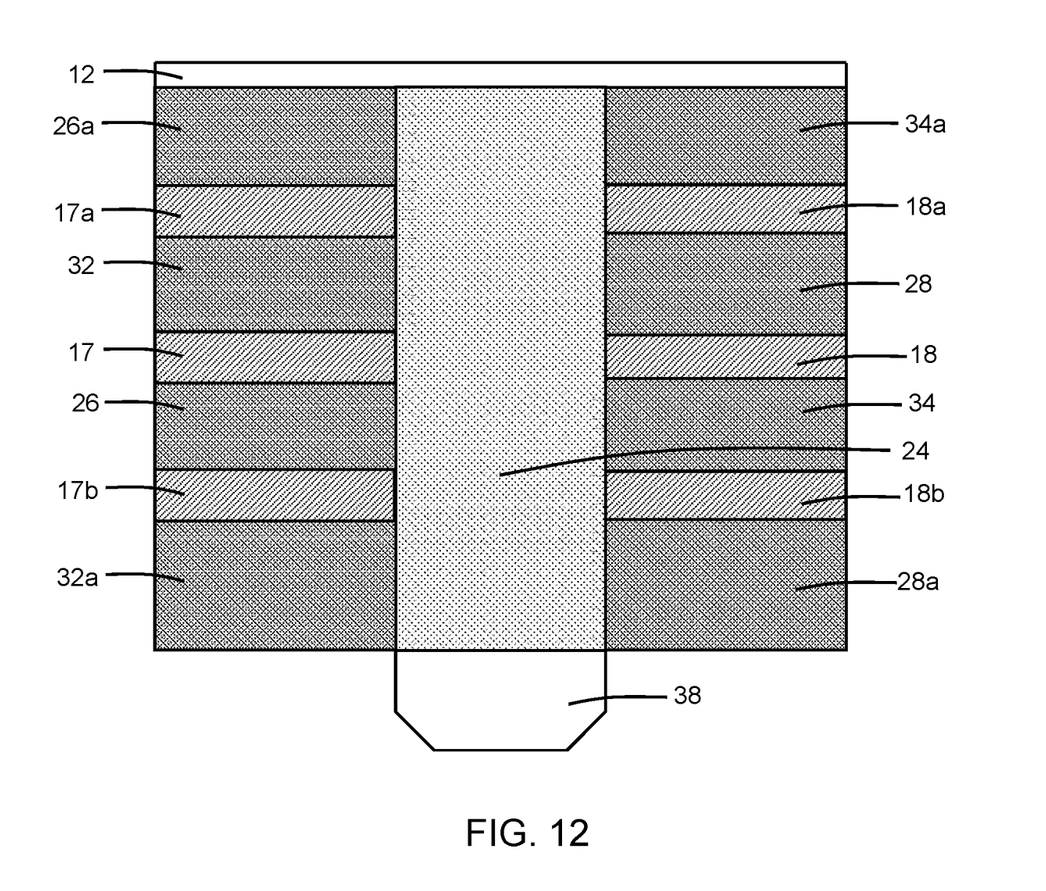
FIGS. 12 and 13 are top views of structures in accordance with alternative embodiments of the invention.

With reference to FIG. 12 in which like reference numerals refer to like features in FIG. 11 and in accordance with alternative embodiments, the photodetector may be modified to increase the number of anode-cathode pairs by adding additional doped regions 26a, 28a and additional doped regions 32a, 34a. Additional shallow trench isolation regions 17a, 17b and 18a, 18b are also positioned in the device layer 12 to provide electrical isolation of the added anodes and cathodes of the photodetector. In the representative embodiment, the doped regions 26, 26a, 32, 32a have a uniform pitch, and the doped regions 28, 28a, 34, 34a have a uniform pitch. In an alternative embodiment, the doped regions 26, 26a, 32, 32a have a non-uniform pitch and the doped regions 28, 28a, 34, 34a have a non-uniform pitch such that the anodes and cathodes may be shaped with different sizes. The shallow trench isolation regions 17, 17a, 17b terminate at the side edge 25 of the layer 24, and the shallow trench isolation regions 18, 18a, 18b terminate at the side edge 27 of the layer 24.

Figure 13:
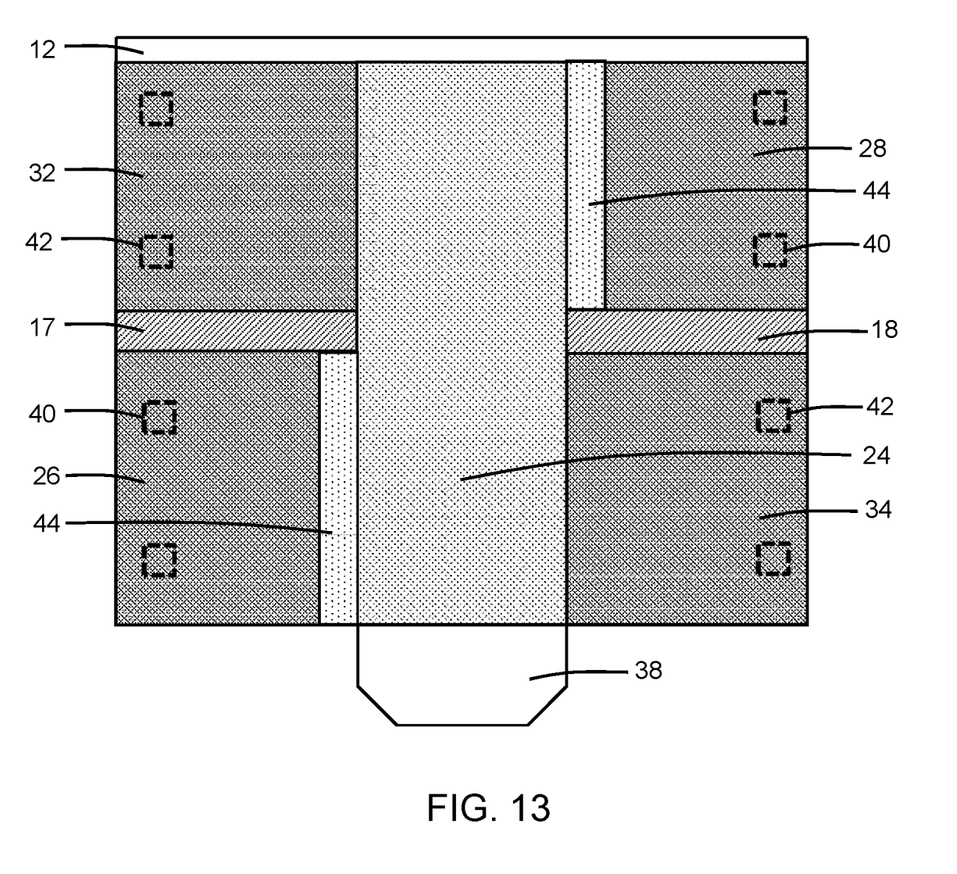

With reference to FIG. 13 in which like reference numerals refer to like features in FIG. 11 and in accordance with alternative embodiments, the photodetector may be modified to add regions 44 that are laterally positioned between the cathodes defined by the doped regions 26, 28 and the layer 24. The regions 44 may be composed of the semiconductor material of the device layer 12 that is lightly doped and that has an opposite conductivity type (e.g., p-type conductivity) from the doped regions 26, 28. The regions 44 may function to further increase the gain of the photodetector. In an alternative embodiment, the photodetector of FIG. 12 may be provided with regions similar to regions 44 and each of these regions is positioned between one of the cathodes and the layer 24.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a photodetector, the structure comprising:
   a light-absorbing region including a first side edge;
   a semiconductor layer including a first doped region and a second doped region, the first doped region defining a first anode adjacent to the first side edge of the light-absorbing region, and the second doped region defining a first cathode adjacent to the first side edge of the light-absorbing region;

a dielectric layer positioned beneath the semiconductor layer; and a first shallow trench isolation region positioned in the semiconductor layer laterally between the first doped region and the second doped region, the first shallow trench isolation region penetrating through the semiconductor layer to the dielectric layer, wherein the first doped region has a first conductivity type, and the second doped region has a second conductivity type opposite from the first conductivity type.

2. The structure of claim 1 wherein the first shallow trench isolation region terminates at the first side edge.

3. The structure of claim 1 wherein the semiconductor layer includes a trench, the light-absorbing region is a layer that is positioned in the trench, and the layer comprises germanium.

4. The structure of claim 1 wherein the light-absorbing region is a layer comprised of germanium.

5. The structure of claim 1 wherein the light-absorbing region includes a second side edge opposite the first side edge, and the semiconductor layer includes a third doped region and a fourth doped region, the third doped region defines a second anode adjacent to the second side edge of the light-absorbing region, the fourth doped region defines a second cathode adjacent to the second side edge of the light-absorbing region, the third doped region has the first conductivity type, and the fourth doped region has the second conductivity type.

6. The structure of claim 5 further comprising:
a second shallow trench isolation region positioned in the semiconductor layer laterally between the third doped region and the fourth doped region,
wherein the first shallow trench isolation region terminates at the first side edge, and the second shallow trench isolation region terminates at the second side edge.

7. The structure of claim 6 wherein the second shallow trench isolation region penetrates through the semiconductor layer to the dielectric layer.

8. The structure of claim 5 wherein the first doped region, the second doped region, the third doped region, and the fourth doped region each extend through an entire thickness of the semiconductor layer to the dielectric layer.

9. The structure of claim 1 wherein the semiconductor layer includes a third doped region and a fourth doped region, the third doped region defines a second anode adjacent to the first side edge, and the fourth doped region defines a second cathode adjacent to the first side edge.

10. The structure of claim 9 further comprising:
a second shallow trench isolation region positioned between the first doped region and the fourth doped region; and
a third shallow trench isolation region positioned between the fourth doped region and the third doped region,
wherein the first shallow trench isolation region, the second shallow trench isolation region, and the third shallow trench isolation region terminate at the first side edge.

11. The structure of claim 1 wherein the first doped region and the second doped region each extend through an entire thickness of the semiconductor layer to the dielectric layer.

12. The structure of claim 1 wherein the first doped region contains a dopant concentration in a range from about $1 \times 10^{17}$ atoms/cm$^3$ to about $5 \times 10^{18}$ atoms/cm$^3$.

13. The structure of claim 1 wherein the second doped region contains a dopant concentration in a range from about $1 \times 10^{17}$ atoms/cm$^3$ to about $5 \times 10^{18}$ atoms/cm$^3$.

14. The structure of claim 1 wherein the semiconductor layer includes a third doped region positioned laterally between the second doped region and the first side edge of the light-absorbing region, and the third doped region has the first conductivity type.

15. A structure comprising:
a light-absorbing region including a side edge;
a semiconductor layer including a first doped region, a second doped region, and a third doped region in the semiconductor layer, the third doped region positioned laterally between the second doped region and the side edge of the light-absorbing region, the first doped region defining an anode adjacent to the side edge of the light-absorbing region, and the second doped region defining a cathode adjacent to the side edge of the light-absorbing region,
wherein the first doped region has a first conductivity type, the second doped region has a second conductivity type opposite from the first conductivity type, and the third doped region has the first conductivity type.

16. The structure of claim 15 wherein the semiconductor layer includes a trench, the light-absorbing region is a layer that is positioned in the trench, and the layer comprises germanium.

17. The structure of claim 15 wherein the light-absorbing region is a layer comprised of elemental germanium.

18. A method of forming a structure for a photodetector, the method comprising:
forming a light-absorbing region;
forming a first doped region in a semiconductor layer, wherein the first doped region has a first conductivity type, the first doped region defines a first anode adjacent to a first side edge of the light-absorbing region, and a dielectric layer is positioned beneath the semiconductor layer; and
forming a second doped region in the semiconductor layer, wherein the second doped region has a second conductivity type opposite from the first conductivity type, and the second doped region defines a first cathode adjacent to the first side edge of the light-absorbing region; and
forming a shallow trench isolation region positioned in the semiconductor layer laterally between the first doped region and the second doped region, wherein the shallow trench isolation region penetrates through the semiconductor layer to the dielectric layer.

19. The method of claim 18 wherein the light-absorbing region includes a second side edge opposite the first side edge, and further comprising:
forming a third doped region in the semiconductor layer, wherein the third doped region has the first conductivity type, and the third doped region defines a second anode adjacent to the second side edge of the light-absorbing region; and
forming a fourth doped region in the semiconductor layer, wherein the fourth doped region has the second conductivity type, and the fourth doped region defines a second cathode adjacent to the second side edge of the light-absorbing region.

20. The method of claim 18 wherein the first doped region is formed by a first ion implantation process, and the second doped region is formed by a second ion implantation process.

\* \* \* \* \*